United States Patent [19]

Lebovici

[11] 4,091,276
[45] May 23, 1978

[54] REMOTE CONTROL SWITCHING

[76] Inventor: Victor Lebovici, 29 Farmington Rd., West Newton, Mass. 02165

[21] Appl. No.: 756,145

[22] Filed: Jan. 3, 1977

Related U.S. Application Data

[63] Continuation of Ser. No. 640,532, Dec. 15, 1975, abandoned.

[51] Int. Cl.$^2$ .................... H01J 39/12; H01J 31/50
[52] U.S. Cl. ......................... 250/214 R; 315/157; 250/213 R
[58] Field of Search .......... 250/213 R, 214 R, 214 P, 250/214 AG, 214 DM, 209; 317/124, 125, 127; 315/156–159, 155, 154; 361/175

[56] References Cited

U.S. PATENT DOCUMENTS

| | | | |
|---|---|---|---|
| Re. 27,393 | 6/1972 | Anselman | 250/214 R |
| 3,584,222 | 6/1971 | Nesbitt | 250/214 R |
| 3,629,590 | 12/1971 | Case | 250/209 |
| 3,754,177 | 8/1973 | O'Reilly | 250/214 R |
| 3,758,826 | 9/1973 | Zizola | 250/214 R |
| 3,767,924 | 10/1973 | Charles et al. | 250/214 R |
| 3,790,848 | 2/1974 | Lai | 250/209 |

Primary Examiner—Alfred E. Smith
Assistant Examiner—David K. Moore
Attorney, Agent, or Firm—Jerry Cohen

[57] ABSTRACT

Electrical appliances, particularly A.C. operated appliances, are turned on and off from remote locations by shining a beam of light, using a flashlight or the like on a photoelectric transducer/semiconductor switching device interconnected between a power line and the appliance, the switching device being bi-stable, activatable for either switch-on or switch-off operations by a signal from a single photoelectric transducer, and further comprises delay means responsive to the occurrence of a switch-on or switch-off operation to prevent a subsequent switching operation until a number of seconds have elapsed to allow for variations of human response in handling of the activating light beam, thereby preventing on and off chattering.

6 Claims, 5 Drawing Figures

REMOTE CONTROL SWITCHING

This is a continuation, of application Ser. No. 640,532, filed Dec. 15, 1975 and now abandoned.

BACKGROUND OF THE INVENTION

The present invention relates to operation of remote electrical appliances wherein finding of buried power lines for an insertion of a switch is avoided by use of an energy transmitter whose location is flexible and receiver connected in the power line, usually adjacent the appliance, to perform these switching functions. The present invention is particularly characterized in affording low-cost, reliable operation, consistent with accommodating the variety of human response factors which may be involved in using such switching equipment.

It is known in the prior art to use light or sound transmitters and receivers to provide remote switching. An example of a prior art device or remote light switching is given in U.S. Pat. No. 3,584,222, granted June 8, 1971 to Nesbitt. In that device, a photoelectric transducer provides triggering current for maintaining a triac conductive to provide power to a remote appliance. At the same time a timing motor is operated to break the power line circuit after a limited time to turn off the appliance. The activating light beam can be passed through window glass thereby providing an additional worth while capability supplementing the freedom from limited location of switch and further freedom from need to seek out power lines which are buried in walls to locate a mechanical switch. It is also known to use optical switching for A.C. appliances wherein activating light beams provide both turn-on and turn-off signals to separate photoelectric transducers, as indicated for instance in U.S. Pat. Nos. 3,767,924 and 3,829,683. In the former a pair of photoelectric transducers when light activated can provide switching on and off triggering signals to a triac via a bi-stable flip-flop electronic circuit and in the latter, a pair of SCR's control operation of oppositely poled relay coils for alternatively operating a mechanical switch on and off.

It is an important object of this invention to provide a light activated semiconductive switching in response to light incident upon a single photoelectric transducer which can accommodate human handling of the light source, as opposed to fixed computer controls of activating light.

It is a further object of the invention to provide reliable, repeatable cycling in such apparatus consistent with the preceding object.

It is a further object of the invention to economically achieve one or more of the foregoing objects.

It is a further object of the invention to provide adjustability of the apparatus of the class described for utilization in different switching situations, consistent with one or more of the preceding objects.

SUMMARY OF THE INVENTION

In accordance with the invention, a system having an A.C. outlet connected to a source of A.C. power by a semiconductor switching device in response to light incident upon a photoelectric transducer, of the class described above in connection with background of the present invention, comprises a flip-flop element having one controlling output indirectly coupled through transistor 19 to the semiconductive switching device for maintaining a switch conductive or non-conductive in first and second stable states, respectively, means for coupling the transducing device to the flip-flop to shift the flip-flop element from one stable state to the other when the signal provided by the transducer exceeds a predetermined threshold level and delayed means responsive to the occurrence of a change in stable state of the flip-flop element for preventing a change in stable state until a predetermined number of seconds has elapsed, typically one to three seconds. The flip-flop element has set and reset inputs coupled to the common photoelectric transducer. The transducer is coupled to the set and reset inputs by first and second NAND gates having outputs coupled to the inputs and also having input legs with the first leg of each NAND gate connected together and to the photoelectric transducing means and the second of each coupled to respective outputs of the flip-flop element.

In accordance with alternative embodiments of the invention, the photoelectric transducing element can be coupled to the flip-flop element by way of a retriggerable mono-stable multivibrator to prevent switching on and off when an incident activating light is held on for unusually long lengths of time compared to the normal switching incident of a human operator holding an activating light source and turning it off or moving it away from line contact with the transducer when the appliance is observed to be turned on.

Other objects, features and advantages of the invention will be apparent from the following detailed description of preferred embodiments taken in connection with the accompanying drawing in which:

DETAILED DESCRIPTION OF PREFERRED EMBODIMENTS

Figure 1:
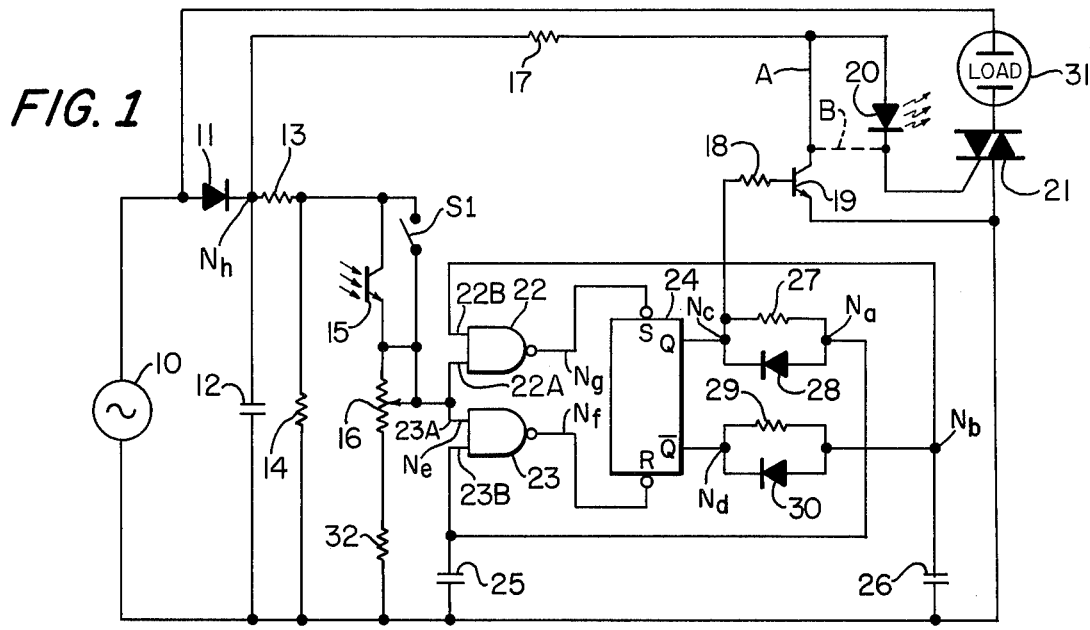
FIGS. 1, 3 and 4 are circuit diagrams of alternative embodiments of the invention.

The FIG. 1, a schematic diagram of a first circuit embodiment of this invention shows a single photoelectric transducer element 15 for controlling a bi-stable element, which in turn provides the gating function for a bi-directional thyristor (triac) 21. The bi-stable element, an R-S flip-flop circuit 24 having first and second stable states is coupled to NAND gates 22 and 23 serving as first and second inputs coupling the transducer 15 to shift the flip-flop between the stable states.

Circuit nodes considered in description, below, of the operation of the circuit are indicated at $N_a$, $N_e$, $N_g$, $N_b$, $N_f$ and $N_H$. The circuit also comprises diodes 11, 28 and 30; resistors 13, 14, 17, 18, 27, 29 and 32; capacitors 12, 25 and 26; potentiometer 16; transistor 19 and light emitting diode 20. An electrical appliance load (e.g., a lamp, hi-fi, television set) is indicated at 31. This circuit is usable with a source 10 of alternating current which may be 117 volt 60 cycle alternating current available in most residential and commercial establishments. The alternating current is converted to a filtered D.C. voltage by a rectifier diode 11 and a capacitor 12. This voltage is reduced to a level compatible with the input circuits of the two NAND gates, 22 and 23 by a voltage divider comprising resistors 14 and 13.

Due to the bi-stable nature of the R.S. flip-flop 24, node Nc can be either a logical 1 or a logical 0. Node Nd will always have the opposite logical state from node Nc. If the flip-flop 24 is set, node Nc goes to a logical 1 and node Nd goes to a logical 0 capacitor 26 is discharged rapidly through the diode 30 disabling NAND gate 22, thus preventing further setting of the flip-flop 24. With node Nc high, capacitor 25 will begin to charge through resistor 27 and the input of the NAND gate which allows resetting of the bi-stable element 24 will not be enabled until node Na exceeds the input of threshold of that NAND gate 23. The time until the threshold is exceeded is dependent upon the selection of resistor 27 and capacitor 25. Once node Na exceeds the input threshold of NAND gate 23, this gate is sensitized and impinging light on the photosensitive element 15 of sufficient intensity to cause node Ne to exceed the input threshold of NAND gate 23 will cause bi-stable element 24 to reset. Increased voltage at node Ne is caused when impinging light on the transducer 15 causes increased current flow through resistor 32 and potentiometer 16. The light need not remain on for bi-stable element to retain its state and should be a momentary pulse of duration shorter than the time it takes for the charging capacitor 25 to sensitize NAND gate 23.

If flip-flop 24 was reset, node Nd is a logical one and node Nc is a logical zero. As node Nc switches to a logical zero, capacitor 25 is discharged rapidly through diode 28 disabling the NAND gate 23, thus preventing further resetting of the flip-flop 24. Capacitor 26 charges through resistor 29 and input node Ne of gate 22 will not be sensitized until node Nb exceeds the input threshold of NAND gate 22 at that input. Once node Nb has risen above the input threshold of the NAND gate 22, the circuitry is armed for the flip-flop 24 to be set. Light incident on transducer element 15 will cause a voltage increase at node Ne causing the output node Ng of NAND gate 22 to go to a logical zero resulting in the setting of the R.S. flip-flop 24.

When node Nc is a logical zero (i.e., flip-flop 24 has been reset) current flows from the voltage source at Node Nh through the current limiting resistor 17, through LED 20 and into the gate of triac 21 turning it on and applying alternating current from the source 10 to load 31. Setting the flip-flop element 24 so that node Nc is a logical one causes current to flow from node Nc through the resistor 18 into the base of the NPN transistor 19 thereby turning the resistor on. The current which would flow into the gate of triac 21 is diverted through the transistor 19 when the transistor is on, and thus triac 21 is turned off preventing the sourcing of alternating current to the load 31.

The delays provided by the R(27), C(25) network and the R(29), C(26) network in arming NAND gates 23 and 22, respectively, eliminate the possibility of chatter in toggling the bi-stable element 24 from a beam of light of short duration or a beam which is erratic in nature. Diodes 28 and 30 disable the inputs which allowed the flip-flop element to toggle, thus creating a dead time in which neither the set nor the reset input is active after the flip-flop element has just toggled.

Figure 2A:
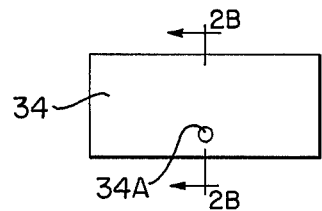
FIGS. 2A and 2B are face and cross-sectioned views of an enclosure usable in connection with any of the FIG. 1, 3 and 4 circuits and other embodiments for limiting the viewing angle of the photoelectric transducer element.
Figure 2B:
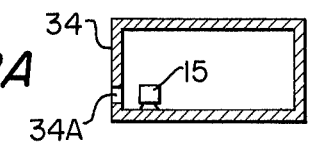

FIG. 2a and 2b show the switching system package 34 which provides the invention with immunity from ambient light activation. An aperture 34A is located on the front of the case. Some distance behind the aperture 34A the photosensitive transducer element 15 is mounted. The photosensitive transducer element is thus sensitive only to those light rays which pass through the aperture 34A and are incident upon it resulting in a very limited cone angle of light acceptance, preferably constructed to be within the range of 10°-20° relative to a foot away point source of light.

Typically, parts circuit values or active component designations are as follows:
Caps. 12 - 150μf, 200V; 11 - 1N2070 diode
Resistors 14 - 2.2K; 28, 29 - 1N914 diode, 16 - 0 to 100K; bi-stable element 24 - Ca4013AN, 18 - 10K, 32 - 2.2K 13 - 27K, 27, 29 - 270K, 17 - 1600Ω, 2W.

Figure 3:
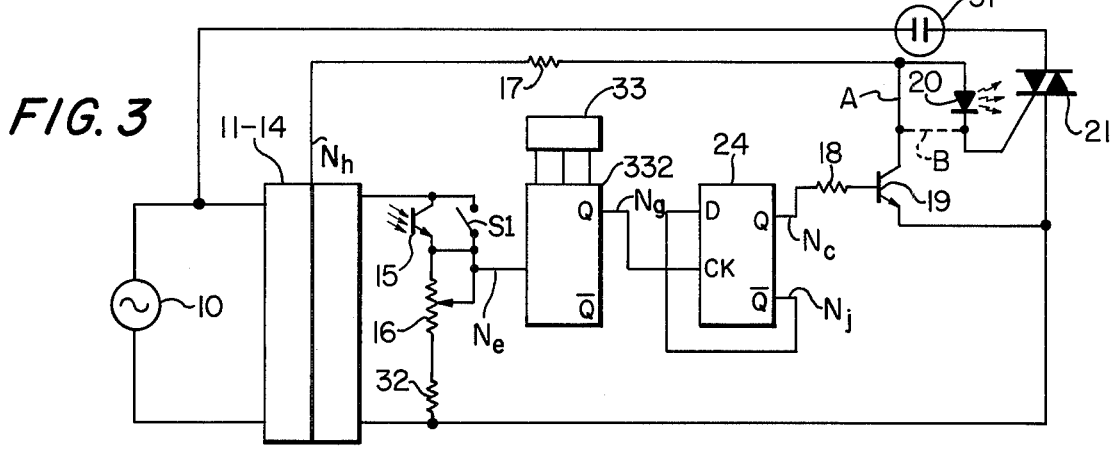

Another embodiment of this invention is illustrated in the schematic diagram shown in FIG. 3. In this embodiment, a single photosensitive element 15 controls the activation of a non-retriggerable monostable element 332. The positive going edge of the pulse at the output of the monostable node Ng, causes the bi-stable element 24 to toggle states thus controlling the bidirectional thyristor 21 which gates power from source 10 to the load 31. The dead time after toggle, in which the device is insensitive to ambient light, is determined by the monostable (332) pulse width which in turn is generated by a pulse width network 33. The rectifier, filter and voltage divider 11–14 (see FIG. 1) are indicated in block form in FIG. 3, but are identical in both embodiments. Parts 15–19 are also identical.

Figure 4:
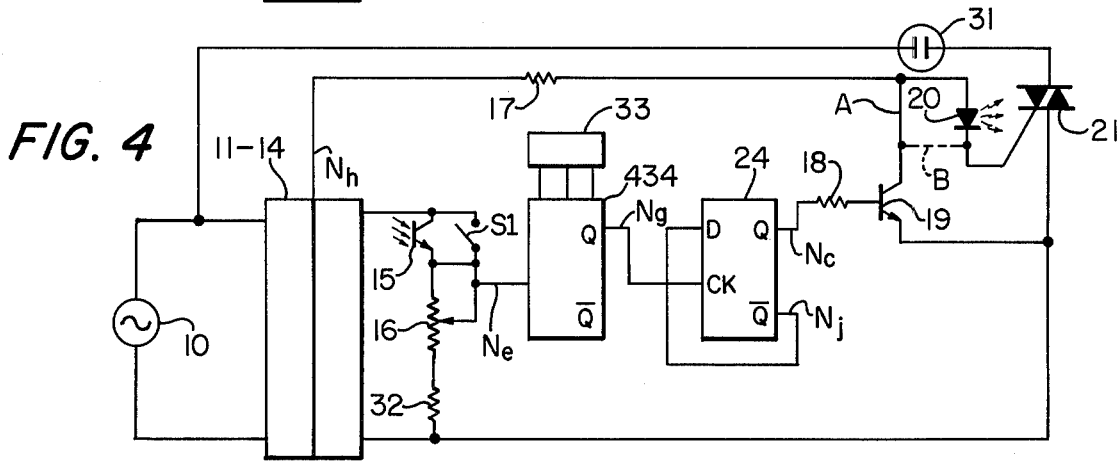

Another embodiment of the invention is illustrated in the schematic diagram shown in FIG. 4 to overcome the limitation of the circuits shown in FIGS. 1 and 3, that continued application of light to photosensitive element 15 results in continued toggling of the bi-stable element 24. If the non-retriggerable monostable element shown in FIG. 3 is replaced with the retrigerable monostable (434) in FIG. 4, than once light strikes the photosensitive element 15 causing the retriggerable monostable element 434 to generate a positive going pulse, the output node Q of the retriggerable monostable element 434 will remain high as long as light remains incident on the photosensitive element 15. This will prevent the bi-stable element 24 from receiving another clock pulse until the light incident on the photosensitive element 15 has disappeared and then has been reapplied. Parts 11–19 are as in the FIG. 1 and 3 embodiments.

Further improvements may be incorporated.

For instance, the addition of a single pole single throw momentary on pushbutton switch allows the invention to be operated locally without a light source. A single pole pushbutton type single throw switch S1 is connected in parallel with the photosensitive element 15. When the pushbutton switch S1 is depressed, the voltage at node Ne increases above the input threshold of the active NAND gate 22 or 23 in FIG. 1 or the input clock threshold (FIGS. 3 or 4), causing the bi-stable element 24 to toggle states.

Another variation of the invention causes the light emitting diode 20 to remain on continuously allowing the location of the switch to be readily determined in a dark room. This is accomplished by eliminating the signal path labeled A (FIGS. 1, 3 and 4) and connecting the signal path labeled B. When the NPN transistor 19 is on, current passes through the light emitting diode 20 and through the transistor 19 causing the light 29 to be on when the bi-directional thyristor is off. Alternatively, when the transistor 19 is off, current passes through the light emitting diode 20 and into the gate of the bi-directional thyristor 21 causing it to turn on. Thus the light emitting diode 20 remains on when the bidirectional thyristor 21 is in a conducting or non-conducting state.

It is evident that those skilled in the art, once given the benefit of the foreoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

What is claimed is:

1. An electrical control system comprising means defining a load, an A.C. outlet connected to a source of A.C. power, bi-directional thyristor switching means, in series betwen the load and outlet and further comprising a control for said thyristor comprising, a flip-flop having one output coupled to said thyristor swtiching device for maintaining said thyristor conductive and nonconductive when in first and second respectively of its two stable states, a single photoelectric transducing device, first and second NAND gate means for coupling said photoelectric transducing device to said flip-flop to shift the flip-flop from one of its stable states to the other when the signal provided by said photoelectric transducer exceeds a predetermined threshold level so that successive exposures of the photoelectric transducing device to light exceeding the level will change the conductive or nonconductive state of the thyristor, and delay means responsive to the occurrence of a change in the stable state of said flip-flop for preventing a subsequent change in the stable state of said flip-flop until a number of seconds have elapsed.

2. The improvement in accordance with claim 1 wherein the flip-flop has set and reset inputs and the said first and second NAND gates have outputs coupled to said set and reset inputs respectively and having a pair of input legs with the first leg of each connected together and to said photoelectric transducing means and the second of each coupled to respective outputs of said flip-flop, said delay means comprising respective capacitors connected to each second input leg of said first and second NAND gates.

3. The improvement in accordance with claim 2 wherein the means for coupling respective outputs of said flip-flop to a NAND gate second input leg is a resistor shunted by a unilaterally conductive device.

4. The improvement in accordance with claim 1 and further comprising, means defining a solid state indicator light connected to the switch which is turned on to indicate conduction through the semiconductor switching device.

5. An electrical control system comprising means defining a load, an A.C. outlet connected to a source of A.C. power, bi-directional thyristor switching means, in series between the load and outlet and further comprising a control for said thyristor comprising, a flip-flop having one output coupled to said thyristor switching device for maintaining said thyristor conductive and nonconductive when in first and second respectively of its two stable states, a single photoelectric transducing device, means for coupling said photoelectric transducing device to said flip-flop to shift the flip-flop from one of its stable states to the other when the signal provided by said photoelectric transducer exceeds a predetermined threshold level so that successive exposures of the photoelectric transducing device is light exceeding the level will change the conductive or nonconductive state of the thyristor, and delay means responsive to the occurrence of a change in stable state of said flip-flop for preventing a subsequent change in the stable state of said flip-flop until a number of seconds have elapsed, and wherein the means for coupling said photoelectric transducing element to said flip-flop and for furnishing the delay comprises a monostable multivibrator, and wherein said monostable multivibrator is retriggerable.

6. The improvement in accordance with claim 5 wherein the flip-flop has D and CK inputs with one of its outputs coupled to said semiconductor switching device, said D input coupled to the other output of said flip-flop and the CK input coupled to the output of said monostable multivibrator.

* * * * *